US010404233B2

(12) United States Patent
Bauder et al.

(10) Patent No.: US 10,404,233 B2
(45) Date of Patent: Sep. 3, 2019

(54) TUNABLE RESONATOR ELEMENT, FILTER CIRCUIT AND METHOD

(71) Applicant: Infineon Technologies AG, Neubiberg (DE)

(72) Inventors: Ruediger Bauder, Feldkirchen-Westerham (DE); Hans-Joerg Timme, Ottobrunn (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 115 days.

(21) Appl. No.: 15/491,711

(22) Filed: Apr. 19, 2017

(65) Prior Publication Data

US 2017/0310302 A1    Oct. 26, 2017

(30) Foreign Application Priority Data

Apr. 25, 2016  (DE) .................. 10 2016 107 658

(51) Int. Cl.
| H03H 9/54 | (2006.01) |
| H01L 41/047 | (2006.01) |
| H01L 41/107 | (2006.01) |
| H03H 3/02 | (2006.01) |
| H03H 9/205 | (2006.01) |
| H03H 9/58 | (2006.01) |
| H03H 9/60 | (2006.01) |

(52) U.S. Cl.
CPC .......... *H03H 9/542* (2013.01); *H01L 41/047* (2013.01); *H01L 41/107* (2013.01); *H03H 3/02* (2013.01); *H03H 9/205* (2013.01); *H03H 9/584* (2013.01); *H03H 9/605* (2013.01); *H03H 2210/012* (2013.01); *H03H 2210/025* (2013.01)

(58) Field of Classification Search
CPC .......... H03H 9/542; H03H 3/02; H03H 9/205; H01L 41/047; H01L 41/107
USPC ............................................. 333/188
See application file for complete search history.

(56) References Cited

U.S. PATENT DOCUMENTS

| 2003/0128081 A1 | 7/2003 | Ella et al. |
| 2005/0174014 A1 | 8/2005 | Korden et al. |
| 2009/0096550 A1* | 4/2009 | Handtmann ......... H03H 9/0095 333/189 |
| 2013/0082799 A1 | 4/2013 | Zuo et al. |

(Continued)

FOREIGN PATENT DOCUMENTS

| DE | 10225201 A1 | 12/2003 |
| JP | 2015045793 A1 | 3/2017 |
| KR | 20140079808 A | 6/2014 |

OTHER PUBLICATIONS

Tittmann et al. ("High Temperature Piezoelectric-A Comparison", 13th International Symposium on Nondestructive Characterization of Materials (NDCM-XIII), May 20-24, 2013, Le Mans, France (Year: 2013).*

(Continued)

*Primary Examiner* — Benny T Lee
*Assistant Examiner* — Hafizur Rahman
(74) *Attorney, Agent, or Firm* — Slater Matsil, LLP

(57) ABSTRACT

A resonator element for use in a filter is provided. The resonator element includes a first resonator acoustically coupled to a second resonator. The first resonator has terminals for incorporation in a filter structure. A tuning circuit is coupled to the second resonator to enable tuning of the resonator element.

22 Claims, 11 Drawing Sheets

(56) References Cited

U.S. PATENT DOCUMENTS

2016/0204763 A1  7/2016  Masakazu
2017/0301992 A1* 10/2017  Khlat ................... H01Q 5/335

OTHER PUBLICATIONS

Bardaweel et al. ("A Comparison of piezoelectric materials for MEMS power generation", The Sixth International Workshop on Micro and Nanotechnology for Power Generation and Energy Conversion Applications, Nov. 29-Dec. 1, 2006, Berkeley, U.S.A., pp. 207-210 (Year: 2006).*

Frederick, AA, et al.,"Frequency tuning of film bulk acoustic resonators", Smart Structures and Materials: Smart Electronics, MEMS, BioMEMS, and Nanotechnology, 617203, Mar. 2006; http://dx.doi.org/10.1117/12.658472, 8 pages.

Reinhardt, A., et al. "Tunable composite piezoelectric resonators: A possible 'Holy Grail' of RF filters?" Microwave Digest (MTT), IEEE MTT-S International, IEEE, Aug. 2012, 3 pages.

Teshigahara, Akihiko, et al., "Scandium aluminum nitride: Highly piezoelectric thin film for RF SAW devices in multi GHz range," Ultrasonics Symposium (IUS), 2012 IEEE International, IEEE, Oct., 2012, 5 pages.

* cited by examiner

TUNABLE RESONATOR ELEMENT, FILTER CIRCUIT AND METHOD

CROSS-REFERENCE TO RELATED APPLICATIONS

This application claims priority to German Patent Application No. 102016107658.9, filed on Apr. 25, 2016, which application is hereby incorporated herein by reference in its entirety.

TECHNICAL FIELD

The present application relates to tunable resonator elements, filters using such tunable resonator elements and corresponding methods.

BACKGROUND

Filters are used in a variety of electronic circuits to filter out certain frequency components of a signal while letting other frequency components pass. For example, in communication circuits filters may be used to block frequency components outside a frequency band or part of a frequency band used for communication and to be processed by further circuits To increase bandwidth, communication standards like wireless communication standards (e.g. LTE, Long-Term Evolution) or also wire-based communication standards continually increased a used frequency range and a number of used frequency bands. In communication devices implementing such standards, often highly selective filters matched to the respective frequency bands are required. The frequency bands used may differ from country to country. Therefore, a plurality of filters having different filter characteristics (for example different passbands) is required. Furthermore, in what is referred to as carrier aggregation several frequency bands are operated at the same time. This requires specific filter designs for exactly those combinations. With a specific filter provided for each possible combination, the number of physical filters is actually much higher than the number of available bands. In order to reduce the number of different filters (two-port up to n-port filters) actually required in a communication device, tunable filters are highly desirable.

As highly selective band pass filters in communication circuits and devices, surface acoustic wave (SAW) or bulk acoustic wave (BAW) technologies are frequently used. Conventional filters of such types are designed for fixed resonance or center frequencies. As a consequence, many filters are required to serve individual frequency bands or aggregated combinations of several frequency bands used in current communication standards like LTE, including WiFi. Radio frequency (RF) switches are then used to select individual filters of the plurality of filters for example for a desired signal path between an antenna and a low noise amplifier or power amplifier. Therefore, in such conventional approaches a large number of mostly discrete components is required, increasing circuit complexity, radio frequency losses, manufacturing complexity and the needed space for radio frequency front ends in communication devices. Space is limited in mobile devices such as smartphones, and therefore tunable solutions are highly desired to save area.

Some approaches have been made to make such SAW or BAW filters tunable in order to decrease the overall number of filters required. However, conventional tuning techniques may have drawbacks regarding their tuning range, their selectivity and/or regarding losses introduced by the possibility of tuning the filter. Therefore, it is an object to provide improved possibilities for filter tuning.

SUMMARY

In accordance with an embodiment, a resonator element for a filter includes a first resonator having a first terminal and a second terminal for coupling to a filter structure; a second resonator having a third terminal and a fourth terminal, where the second resonator is acoustically coupled to the first resonator; and a tuning circuit coupled to the third and fourth terminals.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

In the following, various embodiments will be described in detail referring to the attached drawings. It should be noted that these embodiments serve illustrative purposes only and are not be construed as limiting. For example, while embodiments may be described as comprising a plurality of features, elements or details, in other embodiments some of these features, elements or details may be omitted and/or may be replaced by alternative features, elements or details. In addition to the features, elements or details explicitly described, other features, elements or details, for example components conventionally used in bulk acoustic waves (BAW)-based filters, may be provided.

Features from different embodiments may be combined to form further embodiments unless noted to the contrary. Variations or modifications described with respect to one of the embodiments may also be applicable to other embodiments unless noted otherwise.

Embodiments discussed in the following relate to bulk acoustic wave (BAW) resonator elements which may be used to build a BAW-based filter. For forming BAW resonators, generally a piezoelectric layer is provided between two electrodes. The application of an electric field between the two electrodes generates a mechanical stress that is further propagated through the bulk of the structure as an acoustic wave. A resonance condition is established when the acoustical path and thickness direction of the structure corresponds to integer multiples of half the acoustic wave length.

In embodiments, at least two resonators are used which are acoustically coupled to each other to form a resonator element. A first resonator of the two resonators has terminals to be incorporated in a filter structure. A second resonator is coupled to a tuning circuit. Via the tuning circuit, the position of resonances of the resonator element may be modified.

Figure 1:
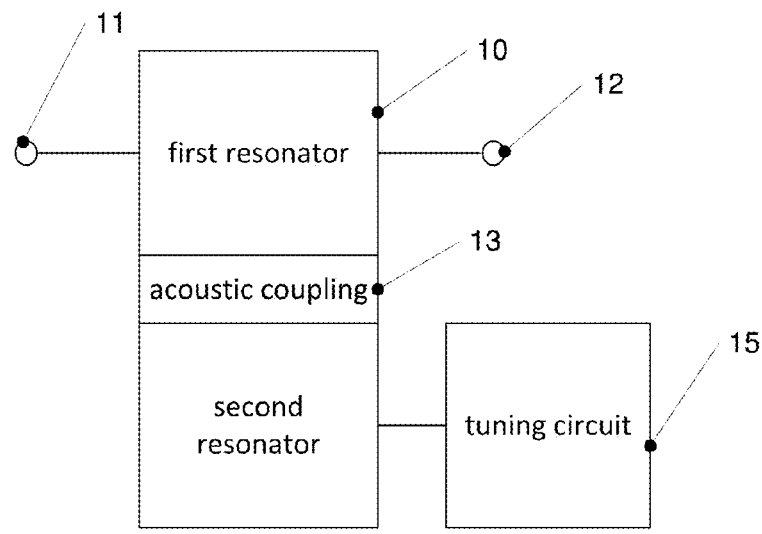
FIG. 1 is a schematic block diagram of a resonator element according to an embodiment.

In addition, in some embodiments the first resonator may be connected to a further tuning circuit FIG. 1 schematically illustrates such a resonator element according to an embodiment. The resonator element of the embodiment of FIG. 1 comprises a first resonator 10 which is coupled with a second resonator 14 via an acoustic coupling 13. Acoustic coupling means in this context that acoustic waves of first resonator 10 may at least partially propagate to second resonator 14 and vice versa. Such an acoustic coupling between resonators may for example be implemented using a dielectric material.

First resonator 10 has a first terminal 11 and a second terminal 12. Using first and second terminals 11, 12 which may for example correspond to or be coupled to electrodes of first resonator 10, the resonator element of FIG. 1 may be incorporated in a filter structure like a ladder filter structure or a lattice filter structure.

Furthermore, a tuning circuit 15 is coupled to second resonator 14. Tuning circuit 15 may comprise an impedance network, which may comprise variable elements like variable impedances, for example a variable capacitor, or switches like radio frequency (RF) switches. By changing a value of the variable element(s) of tuning circuit 15, resonances of the resonator element of FIG. 1 may be shifted. This may be used for building a tunable filter using one or more resonator elements as shown in FIG. 1.

It should be noted that in contrast to some conventional approaches, tuning circuit 15 is electrically decoupled from first resonator 10 and acts on the first resonator 10 only via second resonator 14 and acoustic coupling 13. In some embodiments, this avoids adverse effects compared to tuning circuits directly coupled to first resonator 10.

In some embodiments, first resonator 10 and second resonator 14 may be similar resonator structures using similar materials. In other embodiments, different materials may be used. For example, in an embodiment for first resonator 10 a material with a comparatively low piezoelectric coupling may be used, for example aluminum nitride (AlN). This allows for building filters having a small bandwidth. On the other hand, in embodiments, second resonator 14 may be build based on a material having a comparatively high piezoelectric coupling, for example lithium niobate (LiNbO$_3$) or potassium niobate (KNbO$_3$) or Sc-doped aluminum nitride or aluminum scandium nitride AlScN. This in some embodiments allows for a high tuning range. In some embodiments, the piezoelectric coupling constant $k_T^2$ for the piezoelectric material of the first resonator may be below 30%, for example below 20% or below 10%, while the piezoelectric coupling constant $k_T^2$ the second resonator may be above 10%, for example above 20%, for example above 30% or above 40%. The piezoelectric (electromechanical) coupling constant $k_T^2$ may be calculated from the tensor properties of the respective piezoelectric material, i.e. from elastic stiffness or compliance coefficients, dielectric coefficients, and piezoelectric coefficients. Constant $k_T^2$ is also referred to as a piezoelectric coupling constant for a transversely clamped material; $k_T^2$ may be defined as $k_T^2 = K^2/(1+K^2)$, where piezoelectric coupling constant $K^2$ is defined as $K^2 = e^2/(\varepsilon^S c^E)$, e is the piezoelectric material coefficient, $\varepsilon^S$ the dielectric material coefficient and $c^E$ is the elastic material coefficient of the respective piezoelectric material used.

The piezoelectric coupling constant $k_T^2$ is a measure for the relative bandwidth of an (ideal) piezoelectric resonator. Therefore, in embodiments combinations of different materials for first resonator 10 and second resonator 14 allow on the one hand a small bandwidth, as required for some communication applications, and on the other hand allows for a comparatively wide tuning range. Using an aluminum nitride based resonator as first resonator 10 in embodiments additionally provides a good thermal conduction capable of transporting heat, which may be important for some applications to be able to prevent overheating. However, the above materials are to be taken merely as examples, and other materials may also be used.

First resonator 10 may also be referred to as filter resonator, as it is to be incorporated into a filter structure using first and second terminals 11, 12. Second resonator 14 may also be referred to as a frequency tuning resonator, as it is used for tuning resonance frequencies of the resonator element of FIG. 1 using tuning circuit 15.

First resonator 10, acoustic coupling 13 and second resonator 14 may be implemented in a single material stack using existing process flows.

Figure 2:
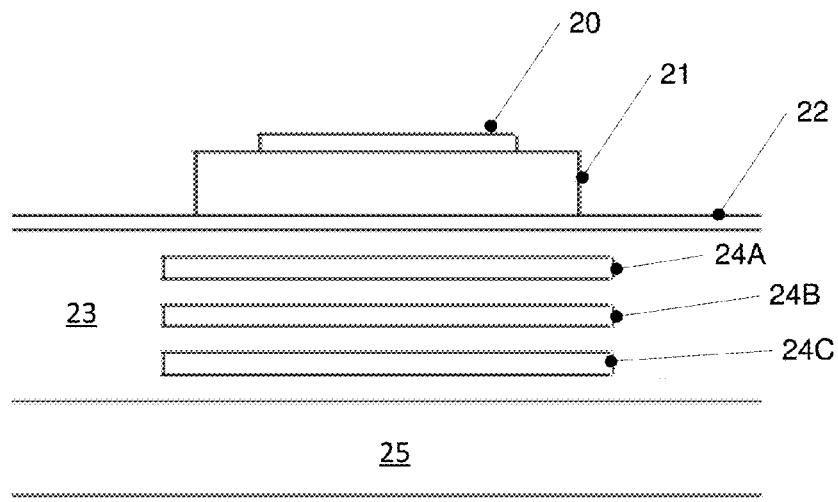
FIG. 2 is a schematic cross-sectional view illustrating implementation of a resonator.

Corresponding stack structures will be discussed next with reference to FIGS. 2 and 3. As an introduction, FIG. 2 shows a resonator element with a single resonator for explanatory purposes. Then, referring to FIG. 3 a resonator stack comprising first and second resonators (for example resonators 10, 14 of FIG. 1) will be explained.

FIG. 2 illustrates a cross-sectional view of a bulk acoustic wave (BAW) resonator. The resonator itself comprises a piezoelectric material 21 sandwiched between a top electrode 20 and a bottom electrode 22. Top electrode 20 and bottom electrode 22 may each be formed by one or more metal layers.

Instead of single resonator as illustrated in FIG. 2, in some embodiments a resonator stack comprising a first resonator and a second resonator is provided, as will be explained in below in FIG. 3.

In the embodiment of FIG. 2, for acoustic isolation of the resonator a so-called acoustic mirror is placed below the resonator. The acoustic mirror of FIG. 2 comprises a sequence of layers with alternating low and high acoustic impedances. For example, in FIG. 2 numeral 23 designates a material with a comparatively low acoustic impedance, whereas 24A to 24C designate layers with a comparatively high acoustic impedance, leading to alternating layers of low and high acoustic impedance below the resonator 20, 21, 22. Each individual layer (portions of material 23 between layers 24A, 24B, 24C, electrode 22 and a substrate 25 as well as layers 24A to 24C themselves) in embodiments has a thickness of approximately λ/4, λ being the acoustic wavelength of a longitudinal wave within the layer. In this respect, it should be noted that λ depends on the respective layer material. This acoustic mirror structure acoustically decouples the resonator from the supporting substrate 25. Instead of such an acoustic mirror, in other embodiments also a cavity may be provided. The cavity may be directly underneath the bottom electrode 22, or under a thin membrane which supports the resonator structure 20/21/22.

The resonance frequencies of a resonator as illustrated in FIG. 2 comprising top electrode 20, piezoelectric material 21 and bottom electrode 22 depends on the thicknesses of all these discussed layers, where the piezoelectric layer thickness has the largest influence, followed by electrode thicknesses. Therefore, in case of FIG. 2 in the absence of further circuits influencing the frequency the resonance frequencies of the resonator are fixed for a specific combination of materials and layer thicknesses and may be changed only by physically changing the structure, for example using processing steps like deposition or etching (as global measures or as local measures defined by lithography).

Figure 3:
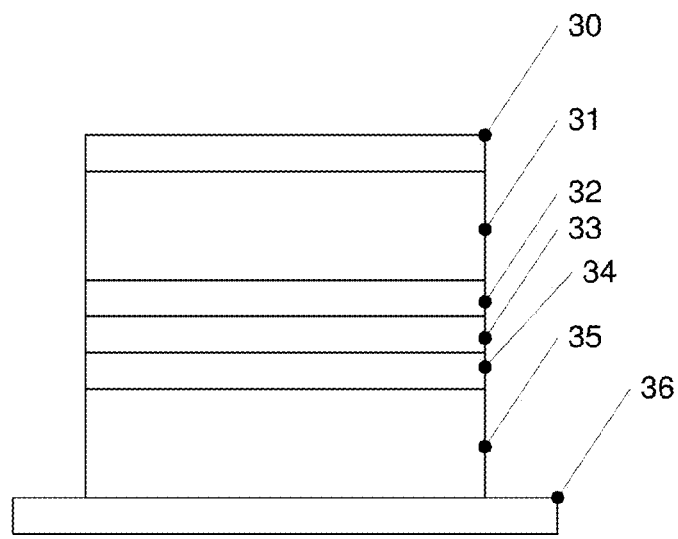
FIG. 3 is a schematic cross-sectional view of a resonator stack usable in embodiments.

FIG. 3 illustrates a resonator stack usable in embodiments. The resonator stack of FIG. 3 in embodiments may for example replace the resonator 20-22 in the cross-sectional view of FIG. 2.

The resonator stack of FIG. 3 comprises a first resonator formed by a first piezoelectric material 31 sandwiched between a first top electrode 30 and a first bottom electrode 32. Furthermore, the resonator stack 3 comprises a second resonator formed by a second piezoelectric material 35 sandwiched between a second top electrode 34 and a second bottom electrode 36. First and second resonators are separated by one or more layers 33 providing acoustic coupling and in some embodiments also electrical isolation. Layers 33 may be formed of one or more dielectric layers. Layers 33 may also comprise a combination of dielectric and conductive (e.g. metal) layers. In embodiments where electric isolation between bottom electrode 32 and top electrode 34 is required (as it is the case for series resonator elements), the one or more layers 33 comprise at least one dielectric (electrically non-conducting) layer. Whether electrically isolating or not, the one or more layers (e.g. layer stack) 33 always provides an acoustical coupling between the first and the second resonator.

Electrodes 30, 32, 34 and 36 each may for example comprise one or more metal layers like aluminum layers, copper layers or wolfram layers, but are not limited thereto. First piezoelectric material 31 and second piezoelectric material 35 in some embodiments may be the same materials. Nevertheless, in some embodiments different materials may be used. For example, as already explained with reference to FIG. 1, first piezoelectric material 31 may be a material with a comparatively low piezoelectric coupling, for example aluminum nitride, and first resonator may serve as a filter resonator as explained above to build a filter having a comparatively narrow bandwidth. An aluminum nitride piezoelectric layer like layer 31 may for example be produced by reactive sputtering from an Al target. Second piezoelectric material 35 may comprise a material having a comparatively high piezoelectric coupling, for example lithium niobate, potassium niobate or Sc-doped aluminum nitride, to provide a large tuning range. Note that Sc-doped AlN layers may also be formed as so-called AlScN layers which may contain a significant amount of Sc. In other embodiments, both piezoelectric layers 31, 35 may be aluminum nitride based, but with different dopants and/or dopant concentration for example different scandium (Sc) concentrations.

It should be noted that in order to properly couple the first and the second resonator, in embodiments the piezoelectric materials of both resonators piezoelectrically couple to a same type (polarization) of acoustic waves. The piezoelectric couplings generally depend on the material but also on the used crystal orientation. The tuning circuit of the second resonator in embodiments may only influence the frequency behavior of the first resonator if both piezoelectric layers couple to the same acoustic wave type/polarization. For example, when sputtered aluminum nitride piezoelectric materials are used, the piezoelectric layer 35 is used in a cut (crystal orientation) offering a strong piezoelectric coupling of the same polarization as piezoelectric layer 31.

For example, in embodiments where aluminum nitride is used in first piezoelectric layer 31 or second piezoelectric layer 35, aluminum nitride may be deposited in c-axis orientation on the substrate material. As substrate material (for example substrate 25 of FIG. 2), a silicon wafer or a lithium niobate ($LiNbO_3$) or lithium tantalate ($LiTaO_3$) crystal may be used.

Figure 4:
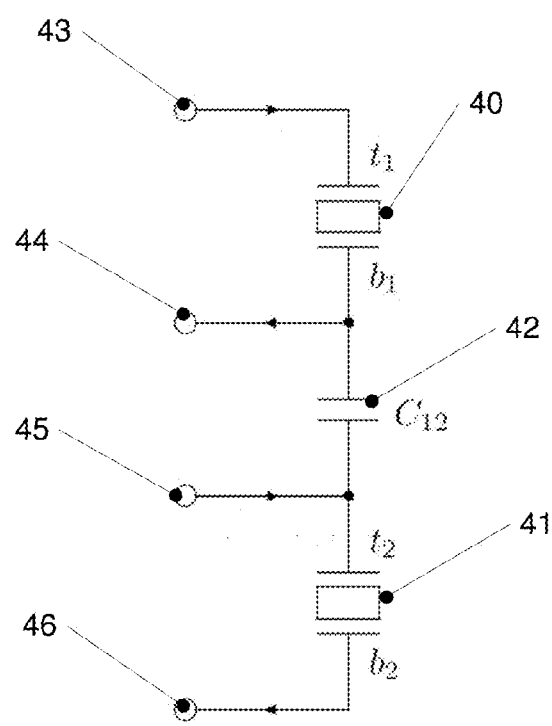
FIG. 4 is an example equivalent circuit of the resonator stack of FIG. 3.

FIG. 4 illustrates an equivalent circuit of the layer stack of FIG. 3. Numeral 40 denotes the first resonator, formed in FIG. 3 by layers 30, 31 and 32, and 41 denotes the second resonator, formed by layers 34, 35 and 36 in FIG. 3. A terminal 43 contacts the first top electrode (30 of FIG. 3, also labelled $t_1$ in FIG. 4), a terminal 44 electrically contacts the first bottom electrode (32 in FIG. 3, also labelled $b_1$), a terminal 45 contacts the second top electrode (34 in FIG. 3, also labelled $t_2$) and a terminal 46 electrically contacts the second bottom electrode (36 in FIG. 3, also labelled $b_2$).

A parasitic capacitor 42 with a capacitance $C_{12}$ is associated with the dielectric layer (stack) 33 between the first resonator's bottom electrode and the second resonators top electrode.

It should be noted that while in the embodiments of FIGS. 3 and 4 first bottom electrode 32 is electrically separate from second top electrode 34, in other embodiments when no separate terminals are needed also a single electrode may be provided serving both as second top electrode and first bottom electrode, and the acoustic coupling of the resonators is then via this common electrode. In this case, no dielectric layer for electrical separation is needed.

In embodiments, terminals 43 and 44 then serve to incorporate the resonator element of FIG. 4 into a filter structure. To provide frequency tuning, a tuning circuit may be coupled to terminals 45 and 46. Examples will be discussed next with reference to FIGS. 5 to 7.

Figure 5:
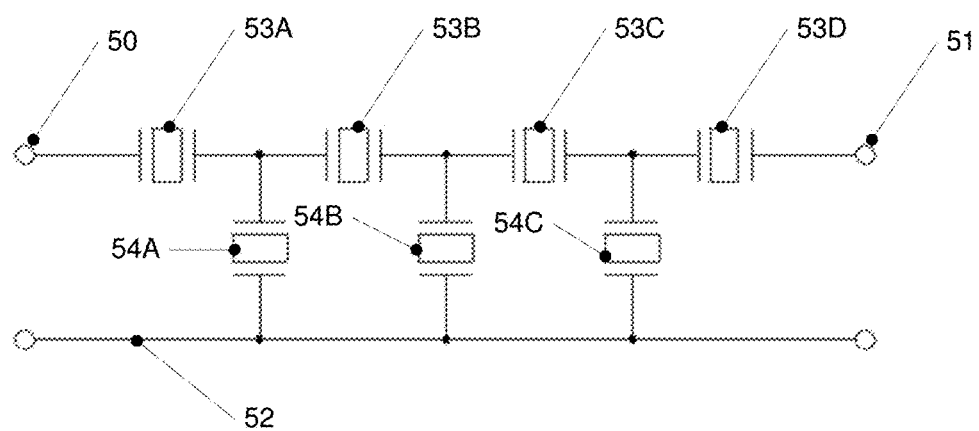
FIG. 5 is an example filter structure which may be implemented using resonator elements according to embodiments.

FIG. 5 illustrates an example topology of a ladder filter, in this case a 3½ stage ladder filter. Numeral 50 denotes a signal input, numeral 51 denotes a signal output and numeral 52 denotes a ground line. The ladder filter of FIG. 5 comprises four series resonators 53A to 53D and three shunt resonators 54A to 54C. Typically all series resonators 53A to 53D have the same resonance frequency, and all shunt resonators 54A to 54C have the same resonance frequencies, but the resonance frequencies of the series and the shunt resonators are detuned with respect to each other. The amount of detuning roughly corresponds to the bandwidth of the resulting filters. The resonance frequencies of the shunt resonators 54A to 54C in typical cases are lower than the resonance frequencies of the series resonators 53A to 53D.

Each of resonators 53A to 53D, 54A to 54C may be a first resonator of a resonator element as discussed previously with respect to FIGS. 1, 3 and 4. Via a tuning circuit coupled to the respective second resonator of the resonator elements, frequency tuning of the filter may be performed. The ladder filter structure of FIG. 5 serves only as an example, and any conventional ladder or lattice filter structures used with BAW resonators in the art may be used and modified by replacing resonators conventionally used by resonator elements comprising first and second resonators as explained with reference to FIGS. 1, 3 and 4. A plurality of such filters may be combined to form an n-port filter structure, for example for filtering a plurality of frequency bands used in communication applications.

Figure 6:
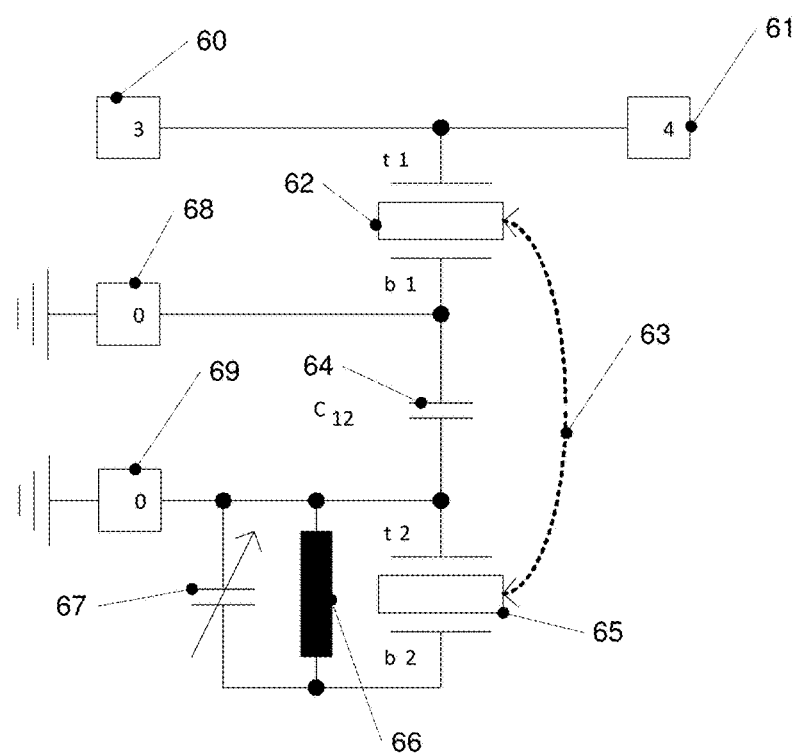
FIG. 6 is a circuit diagram of a resonator element according to an embodiment usable as shunt resonator element.

FIG. 6 illustrates a resonator element according to an embodiment comprising a tuning circuit and usable as shunt resonator element, for example to implement shunt resonators 54A to 54C of the ladder filter structure of FIG. 5.

The resonator element of FIG. 6 comprises a first resonator 62 with a first top electrode t1 and a first bottom electrode b1 and a second resonator 65 with a second top electrode t2 and a second bottom electrode b2. First resonator 62 and second resonator 65 are electrically isolated (but not acoustically decoupled) e.g. by a dielectric material represented by a parasitic capacitance 64. This dielectric material provides an acoustic coupling between the resonators 62, 65 as indicated by an arrow 63. Implementation of first resonator 62 and second resonator 65 may be as explained previously with respect to FIGS. 1, 3 and 4.

First top electrode t1 of first resonator 62 is connected to a first terminal 60 (also labelled "3") and a second terminal 61 (also labelled "4"). Terminals 60, 61 serve for connection with further resonators or signal input/output terminals to build filter structures. For example, when the shunt resonator element of FIG. 6 is used for implementing the shunt resonator 54A of FIG. 5, first terminal 60 is connected with series resonator 53A and second terminal 61 is connected with series resonator 53B.

First bottom electrode b1 of first resonator 62 is coupled to ground via a terminal 68, also labelled "0". In the example filter structure of FIG. 5, this corresponds to the coupling of any one of shunt resonators 54A to 54C to ground line 52.

Second top electrode t2 of second resonator 65 is coupled to ground via a terminal 69 also labelled "0".

Furthermore, a tuning circuit is coupled between second top electrode t2 and second bottom electrode b2 of second resonator 65. In the example of FIG. 6, the tuning circuit comprises a variable capacitor 67 coupled in parallel to an inductance 66. Inductance 66 in some embodiments may be implemented as a high Q (Quality-factor) inductor or other reactance, e.g. having a Q-factor of more than 10, more than 50 or more than 100. An inductivity L1 of the inductor may for example be between 0.5 and 200 nH, for example below 50 nH, e.g. between 1 and 10 nH. Variable capacitor 67 may be implemented in any conventional manner using for example varactors or switched capacitors. By changing the capacitance value of variable capacitor 67, resonances (series resonance and parallel resonance) of the resonator element of FIG. 6 may be tuned. The tuning circuit of FIG. 6 is only an example, and various combinations of capacitances, inductors and/or resistors may be used, one or more of these capacitances, inductors and/or resistors being variable to provide a tuning. In some embodiments, the tuning circuit may also comprise switches like radio frequency (RF) switches that may be selectively opened and closed to tune the resonator element. In such tuning circuits, capacitances or inductivities may be connected in series or parallel to the switch or switches, (e.g. RF switch or switches).

As will be explained later in more detail using simulation results, an inductance 66, e.g. an inductor, may increase a tuning range compared to a case where only a variable capacitor is used.

Figure 7:
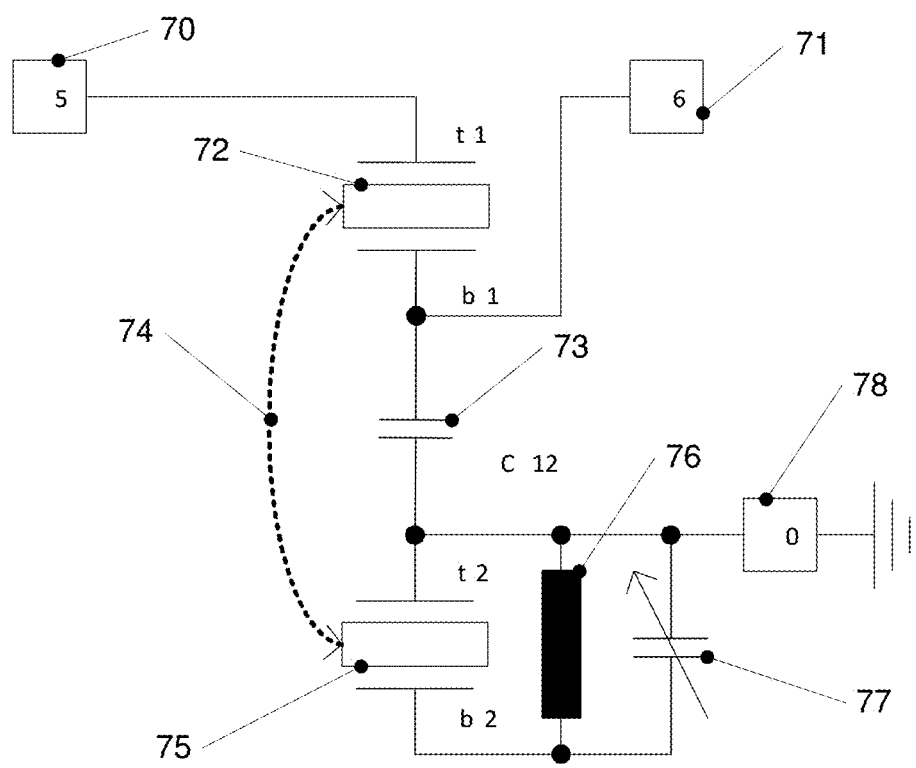
FIG. 7 is a circuit diagram of a resonator element according to an embodiment usable as series resonator element.

FIG. 7 is a circuit diagram of a resonator element suitable as a series resonator in filter structures like the filter structure of FIG. 5, for example for implementing series resonators 53A to 53D. The resonator element of FIG. 7 comprises a first resonator 72 and a second resonator 75 which are electrically separated as indicated by a (parasitic) capacitance 73, having a capacitance value $C_{12}$. Capacitance 73 is associated with some dielectric layer(s) that acoustically couples the first resonator 72 and the second resonator 75, as indicated by an arrow 74. First resonator 72 has a first top electrode t1 and a first bottom electrode b1, and second resonator 75 has a second top electrode t2 and a second bottom electrode b2. First and second resonators 72, 75 may be implemented as explained with reference to FIGS. 1, 3 and 4 above.

First top electrode t1 is coupled with a first terminal 70 also labelled "5", and first bottom electrode B1 is coupled with a second terminal 71, also labelled "6". Via first and second terminals 70, 71, the resonator element of FIG. 7 may be incorporated in a filter structure. For example, to implement series resonator 53A of FIG. 5, first terminal 70 would be coupled to signal input 50, and second terminal 71 would be coupled to resonators 54A and 53B. In case resonator 54A is implemented as in FIG. 6, for example second terminal 71 of FIG. 7 would be coupled with first terminal 60 of FIG. 6, and second terminal 61 of FIG. 6 would then be coupled with a corresponding terminal of resonator 53B.

Second top electrode t2 is coupled to ground via a terminal 78, also labelled "0". The designations 3, 4, 5 and 6 of terminals 60, 61, 70, 71 of FIGS. 6 and 7 will be used later in discussion of simulations referring to FIGS. 8a-d, 9a-d, 10a-d, 11a-d and 12a-d, to 12, while terminals coupled to ground are also labelled "0" in FIGS. 6 and 7.

Furthermore, a tuning circuit is coupled to second top electrode t2 and second bottom electrode b2 comprising for example an inductance 76 and a variable capacitor 77. Impedance 76 and variable capacitance 77 may be implemented in a similar manner as explained for inductance 66 and variable capacitance 67 of FIG. 6, respectively. Furthermore, inductance 76 and capacitance 77 are merely one example for a tuning circuit coupled to second resonator 75, and as also explained for FIG. 6 other tuning circuit configurations are also possible.

With the shunt resonator element of FIG. 6 and the series resonator element of FIG. 7, various filter structures like lattice filters and ladder filters, for example the ladder filter structure of FIG. 5, may be built.

To illustrate functionality of resonator elements discussed above further, simulation results or various configurations will be discussed referring to FIGS. 8 a-d, 9a-d, 10a-d, 11a-d and 12a-d.

Figure 8:
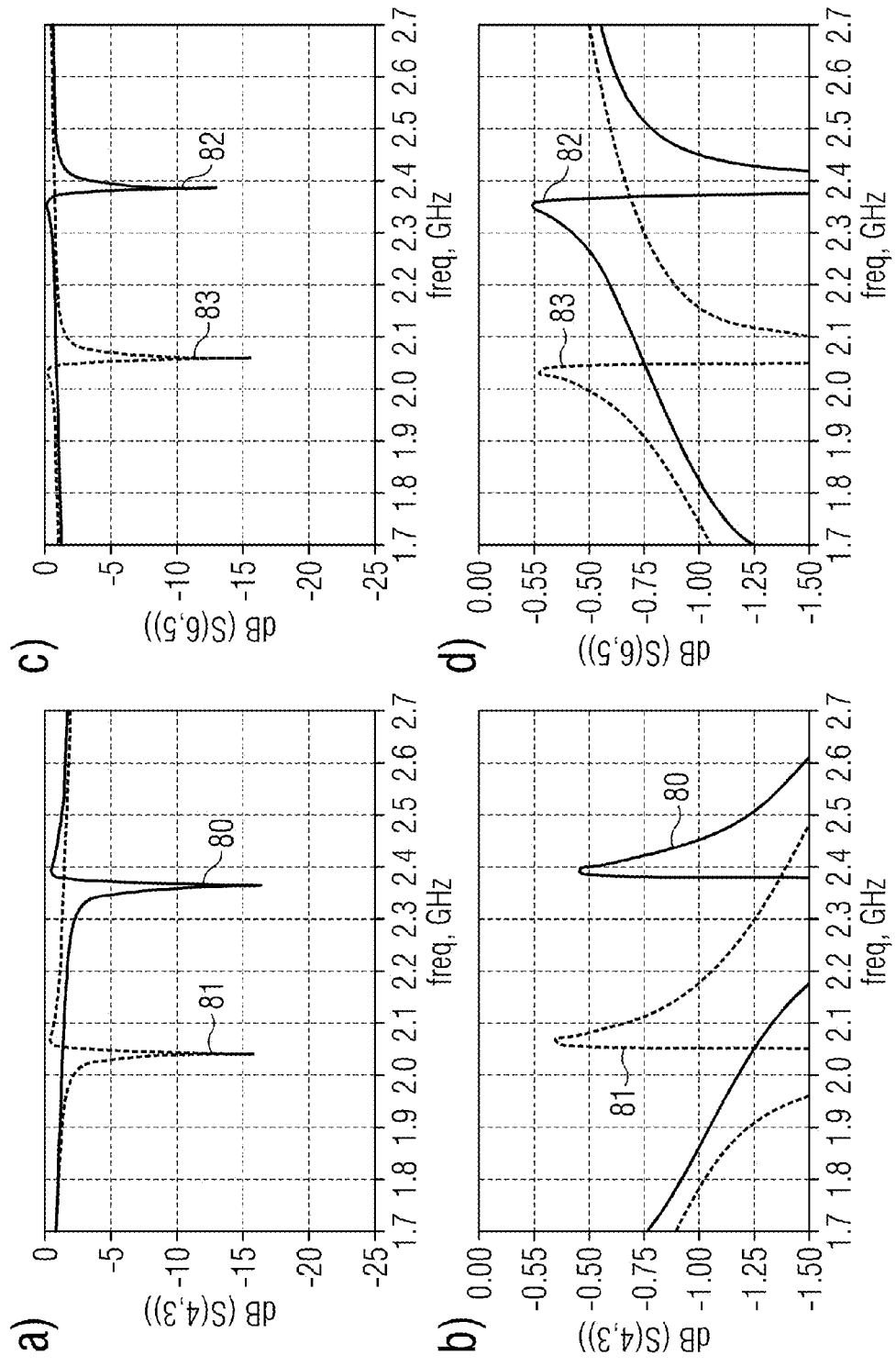
FIGS. 8a-d, 9a-d, 10a-d, 11a-d, 12a-d and 13 illustrate simulation results to illustrate operation of embodiments.
Figure 9:
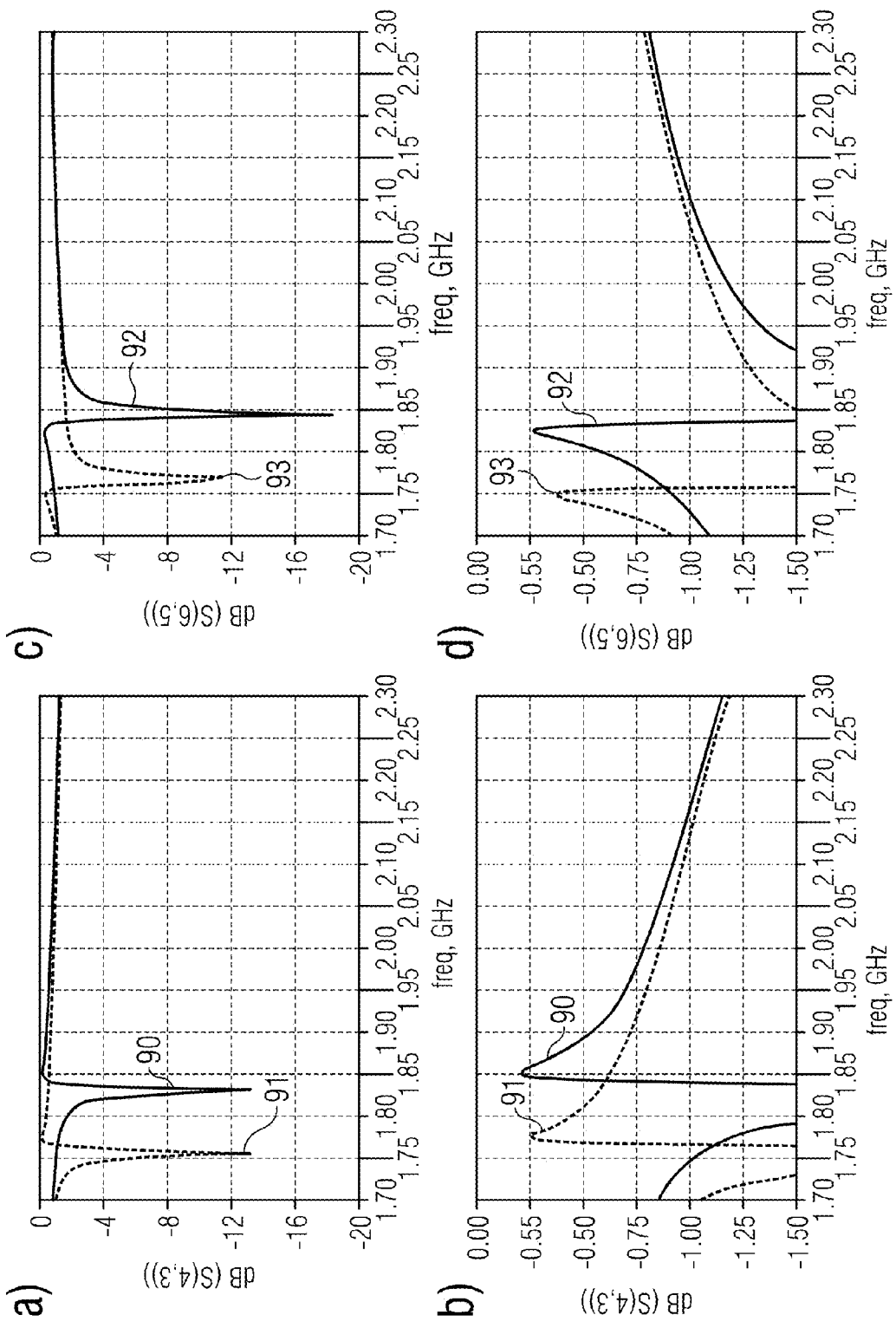
Figure 10:
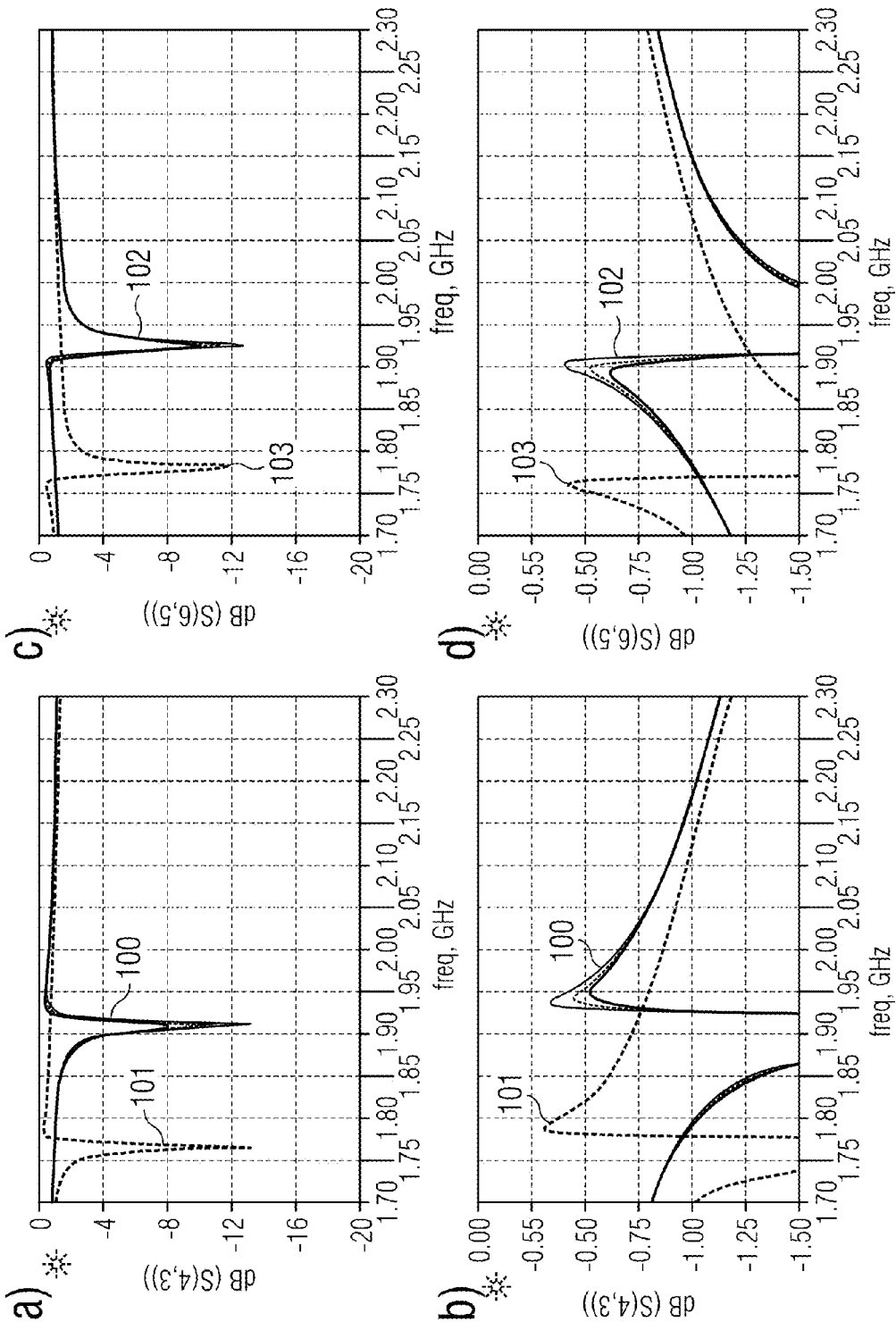
Figure 11:
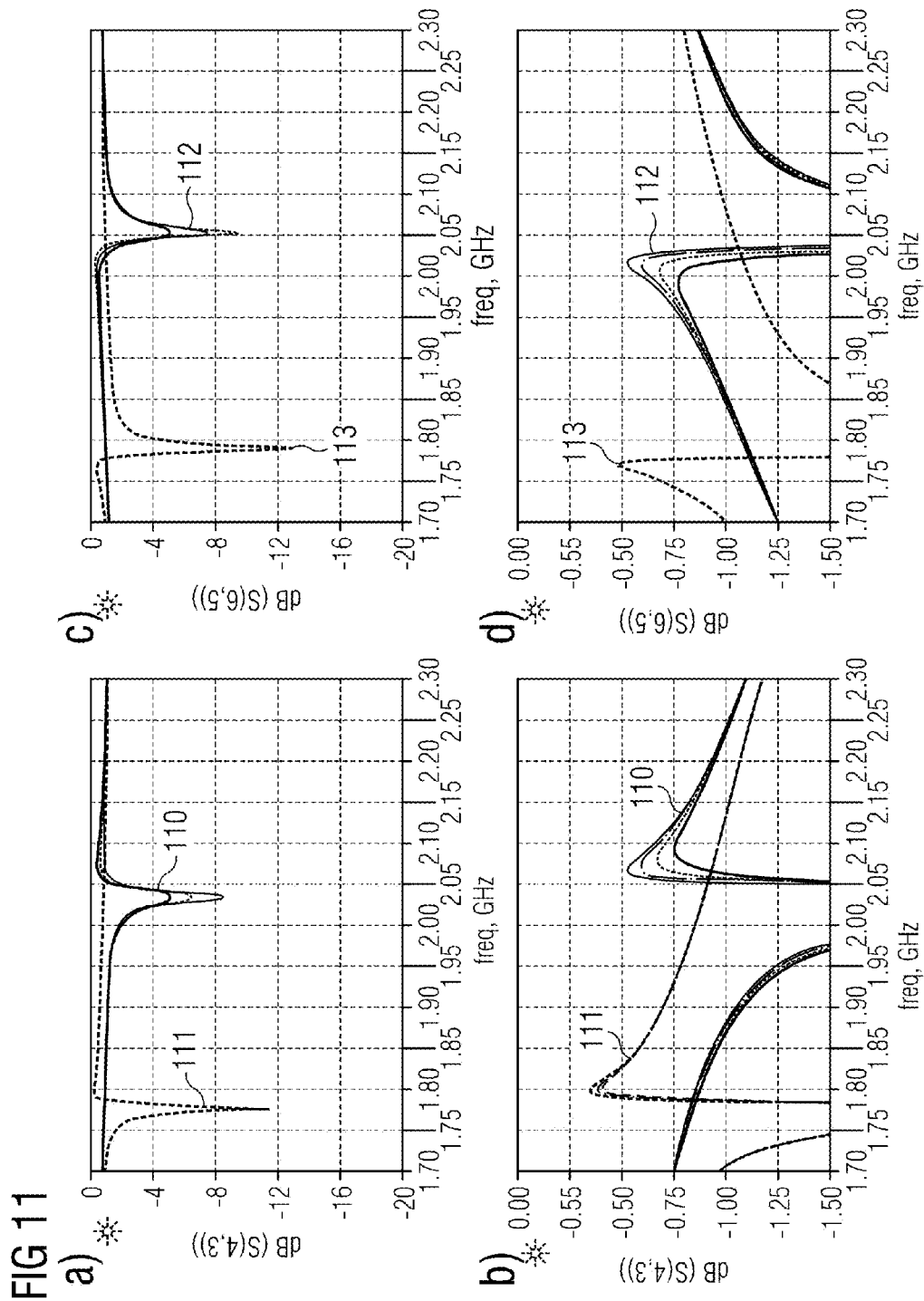
Figure 12:
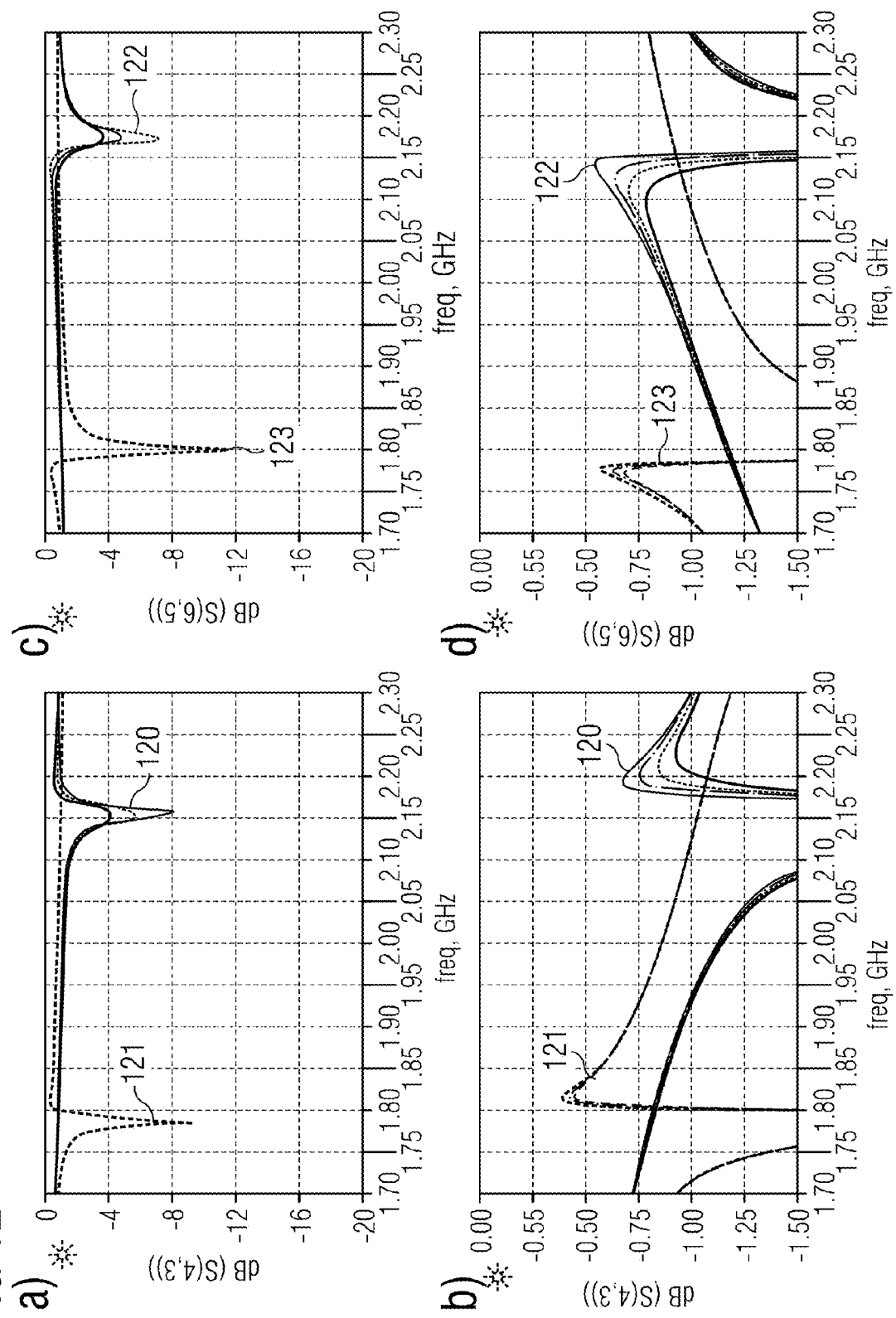

For the simulation of FIGS. 8 a-d, 9a-d, 10a-d, 11a-d and 12a-d, a first resonator (filter resonator) made of doped aluminum nitride (for example scandium doped or doped with another material) with a piezoelectric coupling constant kT2 of 7.1% was assumed, and for the second resonator (frequency tuning resonator) a LiNbO3-crystal based resonator with a piezoelectric coupling constant kT2=25% was assumed.

FIGS. 8(a) to 8(d) show the S-parameter (scattering parameter, representing insertion loss) over frequency for various configurations. In FIGS. 8(a) and 8(b), the S-parameter is shown for a resonator element where the first resonator is coupled in a shunt configuration, as for example illustrated in FIG. 6. FIGS. 8(c) and 8(d) illustrate curves for a series coupling of a first resonator, as illustrated for example in FIG. 7. FIGS. 8(a) and 8(b) illustrate the same curves, with the y-axis being enlarged in FIG. 8(b) compared to FIG. 8(a), and likewise in FIG. 8(d) the y-axis is enlarged compared to FIG. 8(c). In FIGS. 8(a) and 8(b), a curve 80 shows the S-parameter for a tuning circuit comprising an impedance like impedance 66 of FIG. 6. The impedance in the simulation was inductivity of 1 nH with very high quality factor. Furthermore, a small capacitance 67 of 1 pF was assumed. A curve 81 illustrates the S-parameter with an additional capacitance of 10 pF in parallel to the impedance of curve 80. A large shift of the shown resonance of the order of 300 MHz is observed.

A curve 82 in FIGS. 8(*c*) and 8(*d*) illustrates the S-parameter for the series resonator case for a tuning circuit comprising an impedance formed by an inductivity of 1 nH with very high quality factor plus a small capacitance of 1 pF as capacitance, similar to curve 80 of FIGS. 8(*a*) and (*b*), and a curve 83 illustrates the behavior with an additional capacitance of 10 pF coupled in parallel to the impedance. Also here, a frequency shift of the resonance of the order of 300 MHz is observed.

Next, with reference to FIGS. 9*a-d*, 10*a-d*, 11*a-d* and 12*a-d*, the influence of the inductivity of impedance 66 or 76 of FIGS. 6 and 7 will be explained. Similar to FIG. 8*a-d*, in FIGS. 9 to 12, respectively, graphs (a) and (b) illustrate curves for a shunt resonator arrangement as illustrated in FIG. 6, and graphs (c) and (d) show the S-parameter for a series resonator configuration as illustrated in FIG. 7. Also, similar to FIG. 8, in graph (b) of FIGS. 9 through 12 the y-axis is enlarged compared to graph (a), and in graph (d) the y-axis is enlarged compared to graph (c). In each of the graphs of FIGS. 9 to 12, a curve (or set of curves) for a capacitance of 1 pF and a curve or set of curves for a capacitance of 10 pF is shown, similar to what was explained for FIG. 8.

In FIGS. 9*a-d*, impedance 66 and 76, respectively, of the tuning circuit has a value of 100 nH. Curves 90 and 92 show the S-parameter for a capacitance of 1 pF, and curves 91 and 93 show the S-parameter for a capacitance of 10 pF. The shown resonances are shifted by less than 100 MHz both for the shunt resonator case and for the series resonator case.

FIGS. 10*a-d* show the case for an inductivity of 3 nH. Curves 100 and 102 illustrate the S-parameter for a capacitance of 1 pF, and curves 101 and 103 illustrate the S-parameter for a capacitance of 10 pF. Each of curves 100 to 103 comprises a plurality of curves, visible in particular in the enlarged versions of graphs (b) and (d) for curves 91 and 93, respectively. These curves represent the behavior for different Q-factors (quality factors) of the inductivity, for a Q-factor range of 42 to 100. Generally, higher Q-factors lead to more pronounced resonances and reduced insertion loss. The resonances in this case are shifted by about 150 MHz.

FIGS. 11*a-d* illustrate curves for an inductivity value of 1.7 nH. Curves 110 and 112 illustrate the S-parameter for a capacitance of 1 pF, and curves 111 and 113 illustrate the S-parameter for a capacitance of 10 pf. Individual curves of curves 110 to 113, visible in particular in the enlarged views of FIGS. 11(*b*) and (*d*) illustrate different Q-factors for the inductivity, again in the range of 42 to 200. Through the change of capacitance, the resonance is shifted by a little less than 300 MHz.

Finally, FIGS. 12*a-d* illustrate a case with inductivity of 1.3 nH. Curves 120 and 122 illustrate the S-parameter for the capacitance of 1 pF, and curves 121, 123 illustrate the S-parameter for capacitance of 10 pF. Individual curves of curves 120 to 123 illustrate the behavior for different Q-factors. Here, the resonances are shifted by almost 400 MHz. As can be seen, therefore, by reducing the inductivity a larger frequency tuning range may be obtained with the same capacitance variants. However, the difference between different Q-factors becomes more pronounced with reduced inductivities, such that in embodiments using small inductivities below 5 nH high Q-factors above 100, for example above 150, may be selected for implementing the inductivity.

Figure 13:
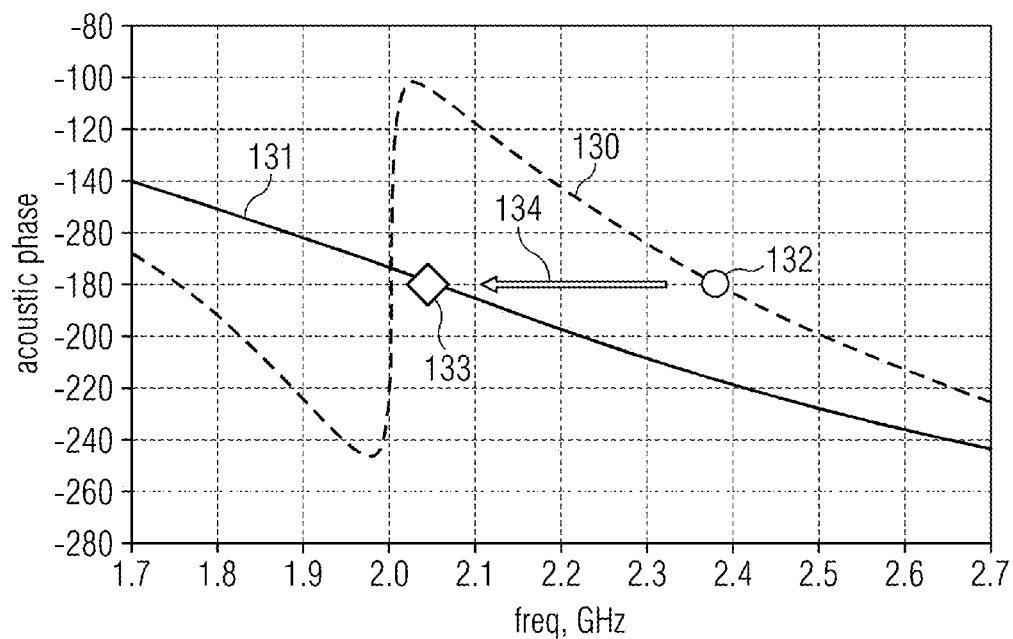

FIG. 13 illustrates the acoustic phase of a resonator stack configured as illustrated in FIG. 6 (shunt resonator configuration), with match intrinsic acoustic port terminations for the acoustic path illustrated by arrow 63. A curve 130 shows the phase with the tuning impedance 66, whereas a curve 131 shows the phase when capacitance 67 is additionally introduced. By changing the capacitance, therefore for example point 132 is shifted to point 133, leading to a tuning range as indicated by an arrow 134.

Figure 14:
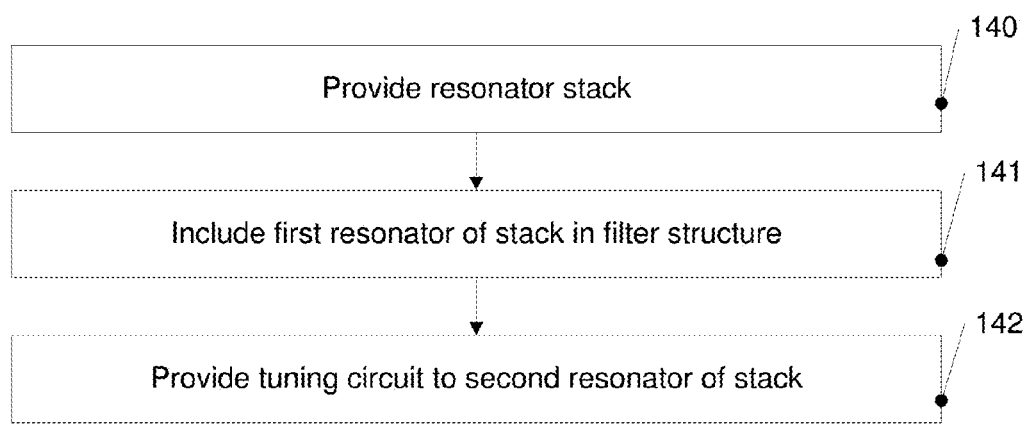
FIG. 14 is a flow chart illustrating a method according to an embodiment.

FIG. 14 illustrates a method according to an embodiment. While the method of FIG. 14 is described as a series of acts or events, the order in which these acts or events are described and shown is not to be construed as limiting. The method of FIG. 14 may be implemented using the resonator elements discussed above, and features, elements, variations and modifications described with respect to these resonator elements are also applicable to the method. For ease of reference, the method of FIG. 14 will be described referring to the previous description of resonator elements. However, the method of FIG. 14 may also be implemented independently from the resonator elements described previously.

At 140 in FIG. 14, a resonator stack is provided. Providing the resonator stack may for example include forming two stacked resonators on a substrate, for example stacked resonators as discussed and described with respect to FIG. 3. Providing the resonator stack may also include providing an acoustic mirror or a cavity below the resonators, as explained with reference to FIG. 2.

At 141, the method includes incorporating a first resonator of the resonator stack, for example the first resonator (filter resonator) of the previously discussed embodiments, in a filter structure. For example, the first resonator may be included in the filter structure as a shunt resonator or as a series resonator.

At 142, a tuning circuit is provided to a second resonator of the resonator stack, for example a tuning circuit comprising an inductor and a variable capacitor, as illustrated in FIGS. 6 and 7. By the tuning circuit, the resonator stack may then be tuned to a desired frequency for use in the filter structure. For example, via the tuning circuit the filter structure may be adapted to different frequency bands used in a communication device.

It should be noted that while in the above-discussed embodiments a tuning circuit is provided only to the second resonator of the respective resonator elements, in other embodiments of resonator elements and methods in addition a further tuning circuit may be provided to the first resonator element. The further tuning circuit may be implemented in a similar manner as has been explained above for the tuning circuit, e.g. as an impedance network.

While filters using resonator elements as described above may in particular be used in communication devices like mobile communication devices, and such communication devices using corresponding filter structures may form embodiments, the filters may also be used in other devices where signals, in particular high frequency signals in GHz-range, are to be filtered.

The above discussed embodiments serve only as examples and are not to be construed as limiting, as other implementation possibilities besides those explicitly shown and described exist.

What is claimed is:

1. A resonator element for a filter, comprising:
 a first resonator having a first terminal and a second terminal for coupling to a filter structure;

a second resonator having a third terminal and a fourth terminal, wherein the second resonator is acoustically coupled to the first resonator; and a tuning circuit coupled to the third and fourth terminals, wherein the first resonator comprises a first piezoelectric material, and the second resonator comprises a second piezoelectric material, and a piezoelectric coupling constant of the first piezoelectric material is lower than a piezoelectric coupling constant of the second piezoelectric material.

2. The resonator element of claim 1, wherein the first resonator and the second resonator are implemented as a resonator stack.

3. The resonator element of claim 2, wherein one of the first resonator or the second resonator is formed on a substrate, and the other one of the first resonator and the second resonator is formed on the one of the first resonator or second resonator.

4. The resonator element of claim 1, further comprising a further tuning circuit coupled to the first and second terminals.

5. The resonator element of claim 1, wherein the second terminal and third terminal are implemented as a common terminal or are electrically coupled to each other.

6. The resonator element of claim 1, wherein the piezoelectric coupling constant kT2 of the first piezoelectric material is smaller than 10%.

7. The resonator element of claim 6, wherein the piezoelectric coupling constant kT2 of the second piezoelectric material is larger than 10%.

8. The resonator element of claim 1, wherein the first piezoelectric material comprises at least one of aluminum nitride or scandium-doped aluminum nitride.

9. The resonator element of claim 1, wherein the second piezoelectric material comprises at least one of lithium niobate, potassium niobate or scandium-doped aluminum nitride.

10. The resonator element of claim 1, wherein the tuning circuit comprises an impedance network.

11. The resonator element of claim 10, wherein the impedance network comprises at least one of a variable capacitance, a switch, a switch in series with a fixed capacitance or a switch in parallel to a fixed capacitance.

12. The resonator element of claim 10, wherein the impedance network comprises at least one inductor.

13. The resonator element of claim 12, wherein the inductor has an inductivity below 50 nH.

14. The resonator element of claim 12, wherein the inductor has a Q-factor of at least 10.

15. A circuit, comprising:
a resonator stack comprising:
a first resonator having a first terminal and a second terminal for coupling to a filter structure, and
a second resonator having a third terminal and a fourth terminal, wherein the second resonator is acoustically coupled to the first resonator; and
a tuning circuit conductively connected to the third terminal and fourth terminal of the second resonator and not conductively connected to the first terminal and the second terminal of the first resonator.

16. A filter device, comprising:
a signal input;
a signal output; and
a resonator element coupled between the signal input and the signal output, wherein the resonator element comprises
a first resonator having a first terminal and a second terminal,
a second resonator having a third terminal and a fourth terminal, wherein the second resonator is acoustically coupled to the first resonator, and
a tuning circuit coupled to the third and fourth terminals, wherein the first resonator comprises a first piezoelectric material, and the second resonator comprises a second piezoelectric material, and a piezoelectric coupling constant of the first piezoelectric material is lower than a piezoelectric coupling constant of the second piezoelectric material.

17. The filter device of claim 16, wherein the first terminal of the first resonator is coupled to the signal input and the signal output, and the second terminal is coupled to ground.

18. The filter device of claim 16, wherein the first terminal of the first resonator is coupled to the signal input, and the second terminal of the first resonator is coupled to the signal output.

19. A method, comprising:
providing a resonator stack including a first resonator and a second resonator;
including the first resonator of the resonator stack in a filter structure; and
providing a tuning circuit to the second resonator of the resonator stack, wherein the first resonator comprises a first piezoelectric material, and the second resonator comprises a second piezoelectric material, and a piezoelectric coupling constant of the first piezoelectric material is lower than a piezoelectric coupling constant of the second piezoelectric material.

20. The method of claim 19, further comprising providing a further tuning circuit to the first resonator.

21. The method of claim 19, wherein providing the resonator stack comprises providing the first resonator and the second resonator separated by at least one dielectric layer.

22. The method of claim 19, wherein providing the tuning circuit comprises providing an inductor in parallel to a variable capacitor.

* * * * *